(12) United States Patent
Zhang et al.

(10) Patent No.: US 10,137,482 B2
(45) Date of Patent: Nov. 27, 2018

(54) STRIPPING DEVICE AND DISPLAY SUBSTRATE PRODUCTION LINE

(71) Applicants: BOE Technology Group Co., Ltd., Beijing (CN); Hefei BOE Optoelectronics Technology Co., Ltd., Hefei (CN)

(72) Inventors: Fan Zhang, Beijing (CN); Wei Hu, Beijing (CN); Xianhao Chen, Beijing (CN); Jianzhao Liu, Beijing (CN); Jianwei Wang, Beijing (CN); Zuhong Liu, Beijing (CN); Daeoh Oh, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/506,301

(22) PCT Filed: Feb. 19, 2016

(86) PCT No.: PCT/CN2016/074099
§ 371 (c)(1),
(2) Date: Feb. 24, 2017

(87) PCT Pub. No.: WO2017/045363
PCT Pub. Date: Mar. 23, 2017

(65) Prior Publication Data
US 2017/0274426 A1    Sep. 28, 2017

(30) Foreign Application Priority Data
Sep. 18, 2015 (CN) .......................... 2015 1 0601440

(51) Int. Cl.
*B08B 3/10* (2006.01)
*B08B 3/02* (2006.01)
(Continued)

(52) U.S. Cl.
CPC ................. *B08B 3/10* (2013.01); *B08B 3/02* (2013.01); *B08B 3/022* (2013.01); *G02F 1/1303* (2013.01);
(Continued)

(58) Field of Classification Search
CPC ........... G02F 1/1333; B08B 3/10; B08B 3/02; B08B 3/08
(Continued)

(56) References Cited

U.S. PATENT DOCUMENTS 4,197,000 A * 4/1980 Blackwood ......... B05B 13/0228
   118/52
5,782,252 A   7/1998 Lewis et al.
(Continued)

FOREIGN PATENT DOCUMENTS

CN    2541872 Y    3/2003
CN    1722002 A    1/2006
(Continued)

OTHER PUBLICATIONS

Jun. 7, 2016—International Search Report and Written Opinion Appn PCT/CN2016/074099 with Eng Tran.
(Continued)

*Primary Examiner* — Spencer E Bell
*Assistant Examiner* — Tinsae B Ayalew
(74) *Attorney, Agent, or Firm* — Banner & Witcoff, Ltd.

(57) ABSTRACT

A stripping device and a display substrate production line are provided. The stripping device comprises a stripping chamber. A stripping liquid with a set temperature is provided within the stripping chamber; the stripping device (Continued)

further comprising a liquid jet component, the liquid jet component includes a liquid supplying pipeline and a liquid jet head, the liquid supplying pipeline is configured to supply a cleaning liquid to the liquid jet head, the liquid jet head is configured to output the cleaning liquid, the liquid supplying pipeline is arranged in the stripping chamber, and the stripping liquid enables the cleaning liquid in the liquid supplying pipeline to reach the set temperature. The stripping device enables the cleaning liquid to reach the set temperature, such that the stripping liquid and the photoresist remaining on the display substrate are effectively removed, the stripping liquid is prevented from being separated out on the display substrate and is further prevented from being crystallized to block an output port of the liquid jet head; and the stripping device further effectively uses the thermal energy in the stripping chamber to save energy consumption.

15 Claims, 2 Drawing Sheets

(51) Int. Cl.
　　*G03F 7/42*　　　(2006.01)
　　*G02F 1/1333*　　(2006.01)
　　*G02F 1/13*　　　(2006.01)
　　*H01L 21/67*　　 (2006.01)
　　*H01L 21/677*　　(2006.01)
(52) U.S. Cl.
　　CPC .............. *G02F 1/1333* (2013.01); *G03F 7/42* (2013.01); *G03F 7/421* (2013.01); *G03F 7/422* (2013.01); *H01L 21/6708* (2013.01); *H01L 21/6776* (2013.01)

(58) Field of Classification Search
　　USPC .......................................... 15/301, 302, 303
　　See application file for complete search history.

(56) References Cited

U.S. PATENT DOCUMENTS

| | | | | |
|---|---|---|---|---|
| 2003/0220708 | A1* | 11/2003 | Sahin | ................ H01L 21/67253 700/121 |
| 2005/0158671 | A1* | 7/2005 | Shimizu | ............ H01L 21/31133 430/329 |
| 2015/0336137 | A1 | 11/2015 | Dong et al. | |

FOREIGN PATENT DOCUMENTS

| | | |
|---|---|---|
| CN | 1858509 A | 11/2006 |
| CN | 203356102 U | 12/2013 |
| CN | 103913959 A | 7/2014 |
| CN | 104167417 A | 11/2014 |
| CN | 104716072 A | 6/2015 |
| CN | 105093594 A | 11/2015 |
| JP | H09213668 A | 8/1997 |
| JP | 2000138200 A | 5/2000 |
| JP | 2002169304 A | 6/2002 |
| JP | 2010119935 A | 6/2010 |

OTHER PUBLICATIONS

Aug. 23, 2017—(CN) First Office Action Appn 201510601440.7 with English Tran.

Zhihua Gu, "The Array Manufacturing Techniques of Thin Film Transistors?TFT)", Fudan University Press, Shanghai, China, Sep. 2007, pp. 305-313.

* cited by examiner

STRIPPING DEVICE AND DISPLAY SUBSTRATE PRODUCTION LINE

The application is a U.S. National Phase Entry of International Application No. PCT/CN2016/074099 filed on Feb. 19, 2016, designating the United States of America and claiming priority to Chinese Patent Application No. 201510601440.7 filed on Sep. 18, 2015. The present application claims priority to and the benefit of the above-identified applications and the above-identified applications are incorporated by reference herein in their entirety.

TECHNICAL FIELD

Embodiments of the present disclosure relates to a technical field of display, and in particular, to a stripping device and a display substrate production line.

BACKGROUND

At present, in a wet stripping process during manufacturing a liquid crystal panel, the main structure and working procedure of a stripping device are as follows: at the front end, a heated stripping liquid reacts with the photoresist on the display substrate in a stripping chamber; and at the rear end, a normal temperature cleaning liquid or a heated cleaning liquid is configured to clean the photoresist stripped from the display substrate in a cleaning chamber. In the cleaning process, the stripped photoresist is washed by spraying the cleaning liquid to the display substrate through a liquid jet component arranged at the joint between the stripping chamber and the cleaning chamber.

In such stripping process, in the case that the normal temperature cleaning liquid is configured to clean, the stripping liquid remaining on the display substrate may be separated out in the relatively low-temperature cleaning liquid environment at the rear end, leading to the defect of stripping liquid residue; meanwhile, the stripping liquid is easily crystallized on an opening of a liquid jet head of the liquid jet component through which the cleaning liquid is sprayed onto the display substrate in the cleaning process, resulting in the blockage of the opening of the liquid jet head.

In addition, there are two manners of cleaning the stripped photoresist by using the heated cleaning liquid. In the first manner, as shown in FIG. 1, a resistance wire 5 for heating is directly mounted on a liquid supplying pipeline at a lower end of the liquid jet head 22; since the heating path in such manner is limited and since the cleaning liquid in the liquid jet component is fast in exchange and not in recycle use, the cleaning liquid is not uniform or insufficient in temperature rising, and a large number of electric energy needs to be consumed. In the other manner, as shown in FIG. 2, an extra liquid supplying tank 231 is provided, a heating pipe 6 is mounted in the liquid supplying tank 231. Since the liquid jet component is opened to spray liquid upon the display substrate 3 passing thereunder and is closed for the rest of time while the two heating manners described above are both keep heating all the time, the electric energy is greatly consumed. In addition, if the heating of the cleaning liquid and the liquid spraying of the liquid jet head 22 are opened at a synchronous interval, the liquid is fast in flow rate and the heating distance is limited, so the heating is insufficient and the cleaning liquid with uniform temperature is unavailable.

SUMMARY

According to embodiments of the disclosure, a stripping device is provided. The stripping device comprises a stripping chamber. A stripping liquid with a set temperature is provided within the stripping chamber. The stripping device further comprising a liquid jet component, the liquid jet component includes a liquid supplying pipeline and a liquid jet head, the liquid supplying pipeline is configured to supply a cleaning liquid to the liquid jet head, the liquid jet head is configured to output the cleaning liquid, the liquid supplying pipeline is arranged in the stripping chamber, and the stripping liquid enables the cleaning liquid in the liquid supplying pipeline to reach the set temperature.

For example, a sprayer is arranged in the stripping chamber and is configured to spray the stripping liquid with the set temperature; and the liquid jet head is located outside the stripping chamber and the liquid jet head is connected to an end part of one end of the liquid supplying pipeline.

For example, the liquid supplying pipeline is zigzagged in a continuous S-shaped curve.

For example, the liquid supplying pipeline includes two or more sub-pipelines, which are parallel with one another and are connected end to end in sequence.

For example, the liquid supplying pipeline is arranged in a spiral curve.

For example, the liquid supplying pipeline is paved at a bottom of the stripping chamber or suspended on a side wall of the stripping chamber.

For example, the stripping chamber includes a plurality of sub-stripping chambers, the plurality of sub-stripping chambers are mutually communicated to form the stripping chamber, and the liquid supplying pipeline is continuously arranged in the plurality of sub-stripping chambers.

For example, the liquid jet component further includes a supplying source for supplying the cleaning liquid, an end part of the other end of the liquid supplying pipeline is connected to the supplying source, and the supplying source includes a liquid supplying tank for containing the cleaning liquid and a pressure pump for inputting the cleaning liquid in the liquid supplying tank into the liquid supplying pipeline.

For example, the pressure output from the pressure pump is in direct proportion to a flow rate of the cleaning liquid in the liquid supplying pipeline, and the pressure output from the pressure pump is adjustable.

For example, the stripping device further comprises a cleaning chamber. The cleaning chamber is communicated with the stripping chamber and is configured to clean a photoresist stripped from a display substrate, and the liquid jet head is provided in the cleaning chamber.

For example, the cleaning chamber further includes a plurality of sprayers for spraying the cleaning liquid.

According to embodiments of the disclosure, a display substrate production line is provided. The display substrate production line comprises the stripping device as described above.

DETAILED DESCRIPTION

For those skilled in the art to better understand the technical solution of the present disclosure, the stripping device and display substrate production line provided by the present disclosure are further described in detail in combination with the drawings and specific embodiments.

Embodiment 1

Figure 1:
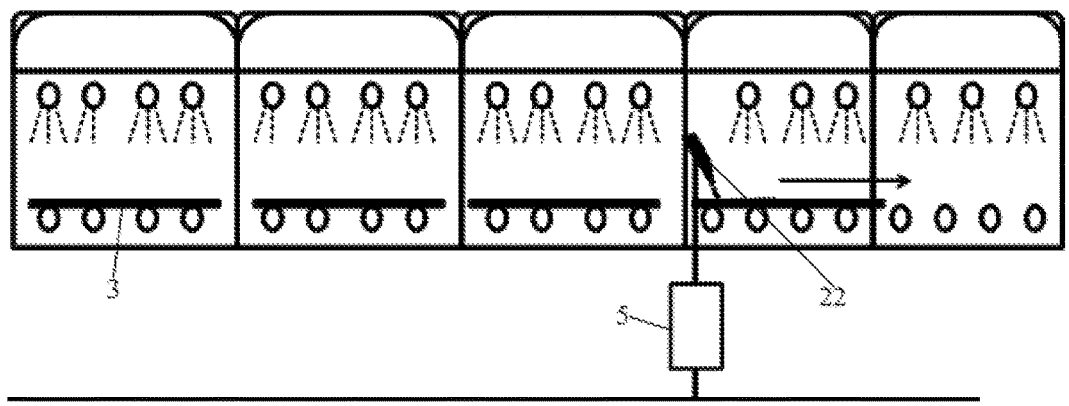
FIG. 1 is a structural schematic view illustrating that a liquid jet component in a stripping device heats a cleaning liquid according to one technique.
Figure 2:
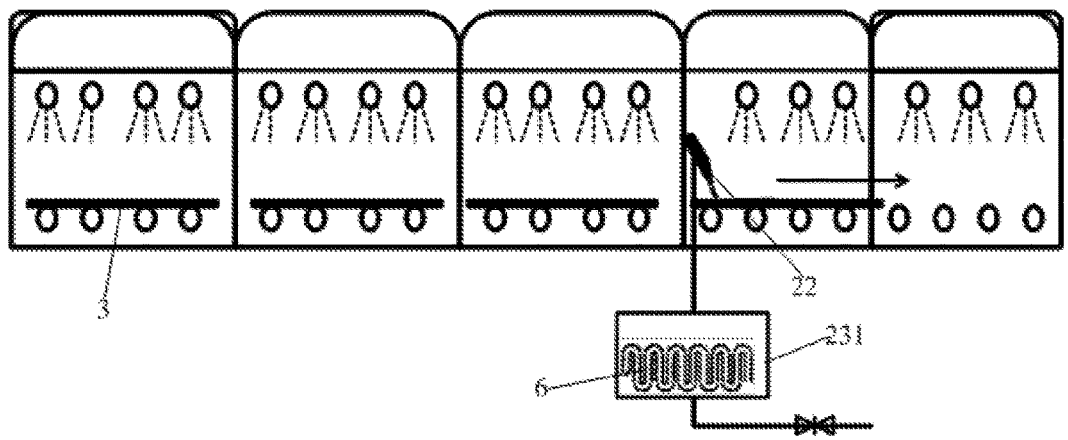
FIG. 2 is a structural schematic view illustrating that the liquid jet component in the stripping device heats the cleaning liquid according to another technique.
Figure 3:
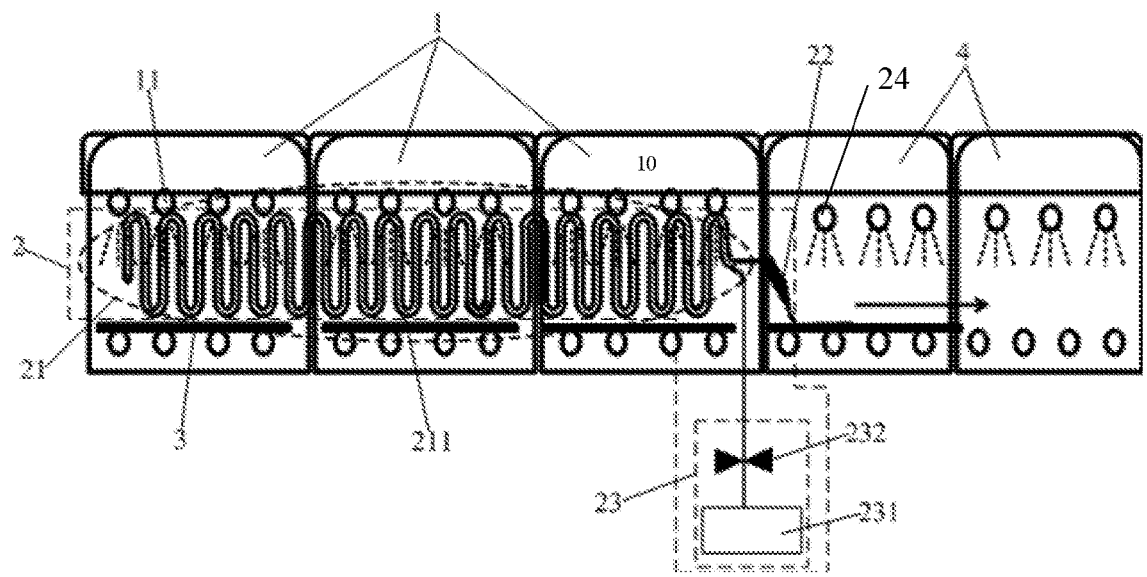
FIG. 3 is a structural schematic view illustrating a stripping device in Embodiment 1 of the present disclosure.

The present embodiment provides a stripping device, as shown in FIG. 3, the stripping device comprises a stripping chamber 1, a stripping liquid with a set temperature is provided within the stripping chamber 1, and the stripping liquid strips a photoresist provided on a display substrate 3; and the stripping device further comprises a liquid jet component 2 for cleaning the photoresist stripped from the substrate 3, the liquid jet component 2 includes a liquid supplying pipeline 21 and a liquid jet head 22, the liquid supplying pipeline 21 is configured to supply a cleaning liquid to the liquid jet head 22, the liquid jet head 22 is configured to output the cleaning liquid, the liquid supplying pipeline 21 is provided in the stripping chamber, and the stripping liquid enables the cleaning liquid in the liquid supplying pipeline 21 to reach the set temperature.

According to the stripping device, the liquid supplying pipeline 21 is provided in the stripping chamber 1, such that the cleaning liquid flows in the stripping chamber 1 providing the stripping liquid with the set temperature, then flows out of the stripping chamber 1, and enters the liquid jet head 22; the cleaning liquid output from the liquid jet head 22 reaches the set temperature after heated by the stripping liquid in the stripping chamber 1, in this way, the stripping liquid and photoresist remaining on the display substrate 3 are better dissolved in the cleaning liquid with the set temperature, such that the stripping liquid and the photoresist remaining on the display substrate 3 are effectively removed, the stripping liquid is prevented from being separated out on the display substrate 3 and is further prevented from being crystallized to block an output port of the liquid jet head 22; in addition, compared with the structure of separately heating a lower end of a liquid supplying pipeline of the liquid jet component, the stripping device effectively uses the thermal energy existing in the stripping chamber 1 to save energy consumption.

For example, a sprayer 11 is arranged in the stripping chamber 1 and is configured to spray the stripping liquid with the set temperature; the liquid jet head 22 is located outside the stripping chamber 1, the liquid jet head 22 is connected to an end part of one end of the liquid supplying pipeline 21, the cleaning liquid output from the liquid jet head 22 is sprayed onto the display substrate 3 to wash the photoresist stripped from the display substrate 3. The stripping liquid sprayed from the sprayer 11 has the set temperature, the stripping liquid causes the temperature in the stripping chamber 1 to rise, such that the temperature of the cleaning liquid in the liquid supplying pipeline 21 arranged in the stripping chamber 1 increases; in the case that the heated cleaning liquid flows out from the liquid jet head 22 to clean the display substrate 3, the stripping liquid remaining on the display substrate 3 is prevented from being separated out on the display substrate 3, and is further prevented from being crystallized to block the output port of the liquid jet head 22.

In the present embodiment, for example, the liquid supplying pipeline 21 is zigzagged in a continuous S-shaped curve. The liquid supplying pipeline 22 includes two sub-pipelines 211, which are parallel with one another and are connected end to end in sequence, that is, the two sub-pipelines 211 are mutually connected into a whole liquid supplying pipeline 21, and the length of the liquid supplying pipeline 22 is the total length of two continuous S-shaped sub-pipelines 211. Due to such arrangement, the total length of the liquid supplying pipeline 21 in the stripping chamber 1 is long enough, such that the cleaning liquid in the liquid supplying pipeline 21 is fully heated under the action of the stripping liquid, and the cleaning liquid finally flowing out of the liquid jet head 22 has the set temperature.

It is noted that the liquid supplying pipeline 21 for example includes more than three sub-pipelines 211, which are parallel with one another and are connected end to end in sequence, that is, in order to further increase the total length of the liquid supplying pipeline 21 in the stripping chamber 1 so as to more sufficiently heat the cleaning liquid in the liquid supplying pipeline 21, the total length of the liquid supplying pipeline 21 is further increased; for example, the liquid supplying pipeline 21 for example comprises three or more sub-pipelines 211 arranged in parallel, the sub-pipelines 211 are mutually connected into a whole liquid supplying pipeline 21, in this way, the cleaning liquid in the stripping chamber 1 flows by a longer path, that is, the retention time of the cleaning liquid in the stripping chamber 1 is increased, and the cleaning liquid is fully heated.

In the present embodiment, for example, the liquid supplying pipeline 21 is suspended on a side wall of the stripping chamber 1. In one example, the liquid supplying pipeline 21 is paved at a bottom of the stripping chamber 1. Due to such arrangements, the cleaning liquid in the liquid supplying pipeline 21 is fully heated under the action of the stripping liquid.

In the present embodiment, for example, the stripping chamber 1 includes a plurality of sub-stripping chambers 10, the plurality of sub-stripping chambers 10 are mutually communicated to form the stripping chamber 1, and the liquid supplying pipeline 21 is continuously arranged in the plurality of sub-stripping chambers 10. The larger the number of the sub-stripping chambers 10 is, the longer the length of the stripping chamber 1 is; due to such arrangement, not only the photoresist on the display substrate 3 is thoroughly stripped off under the action of the stripping liquid, but also the length of the liquid supplying pipeline 21 is further increased such that it is favorable to fully heat the cleaning liquid in the liquid supplying pipeline 21. The respective sub-stripping chambers 10 are same in structure, or are different in structure, which is not limited in the present disclosure as long as the liquid supplying pipeline 21 for fully heating the cleaning liquid to the set temperature is arranged in the whole stripping chamber 1 formed by these mutually communicating sub-stripping chambers 10.

In the present embodiment, for example, the liquid jet component 2 further includes a supplying source 23 for supplying the cleaning liquid, the end part of one end of the liquid supplying pipeline 21 is connected to the liquid jet head 22 to spray the cleaning liquid to the display substrate 3, an end part of the other end of the liquid supplying pipeline 21 is connected to the supplying source 23, and the supplying source 23 includes a liquid supplying tank 231 for containing the cleaning liquid and a pressure pump 232 for inputting the cleaning liquid in the liquid supplying tank 231 into the liquid supplying pipeline 21.

The pressure output from the pressure pump 232 is in direct proportion to a flow rate of the cleaning liquid in the liquid supplying pipeline 21, and the pressure output from the pressure pump 232 is adjustable. That is, by adjusting the pressure output from the pressure pump 232, the flow rate of the cleaning liquid in the liquid supplying pipeline 21 is correspondingly adjusted, such that the retention time of the cleaning liquid in the stripping chamber 1 is controlled, and further the heated degree of the cleaning liquid in the stripping chamber 1 is controlled to control the temperature of the cleaning liquid output from the output port of the liquid jet head 22.

In the present embodiment, for example, the stripping device further comprises a cleaning chamber 4, the cleaning chamber 4 is communicated with the stripping chamber 1 and configured to clean the photoresist stripped from the display substrate 3, and the liquid jet head 22 is arranged in the cleaning chamber 4. For example, a plurality of sprayers 24 for spraying the cleaning liquid are arranged in the cleaning chamber 4; due to such arrangement of the cleaning chamber 4, the photoresist stripped from the display substrate 3 and the stripping liquid remaining on the display substrate 3 are thoroughly cleaned away.

In the operation process of the stripping device, the display substrate 3 firstly enters the stripping chamber 1, the sprayer 11 in the stripping chamber 1 spray the stripping liquid to the display substrate 3, the stripping liquid reacts with the photoresist on the display substrate 3 to strip off the photoresist, meanwhile, the stripping liquid having the set temperature (for example, 40-70° C.) heats the liquid supplying pipeline 21 arranged in the stripping chamber 1 such that the temperature of the cleaning liquid in the liquid supplying pipeline 21 rises to the set temperature; next, the display substrate 3 is carried into the cleaning chamber 4, and in the cleaning chamber 4, the liquid jet head 22 sprays the cleaning liquid reaching the set temperature to the display substrate 3; meanwhile, the sprayers 24 in the cleaning chamber 4 spray the cleaning liquid to the display substrate 3, and the cleaning liquid wash the photoresist stripped from the display substrate 3 and the residual stripping liquid off.

Embodiment 2

Figure 4:
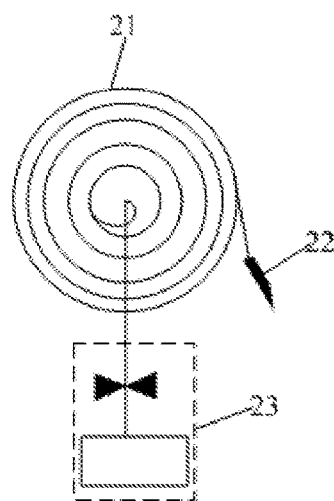
FIG. 4 is a structural schematic view illustrating a liquid jet component in Embodiment 2 of the present disclosure.

The present embodiment provides a stripping device, and the difference from Embodiment 1 is that, as shown in FIG. 4, the liquid supplying pipeline 21 is arranged in a spiral curve.

The length of the liquid supplying pipeline 21 arranged in the spiral curve is set according to specific needs as long as the temperature of the cleaning liquid supplied in the liquid supplying pipeline 21 reaches the set temperature after passing by a path with certain length in the stripping chamber.

It is noted that the arranging shape of the liquid supplying pipeline 21 may also be in other shapes, (for example, rectangle annular, circle annular, etc.), as long as the temperature of the cleaning liquid in the liquid supplying pipeline 21 reaches the set temperature after passing by a path with certain length in the stripping chamber.

Other structures of the stripping device in the present embodiment are same as those in embodiment 1 and are not repeated.

The embodiments 1 and 2 have the beneficial effects: according to the stripping device provided by the embodiments 1 and 2, the liquid supplying pipeline is arranged in the stripping chamber, such that the cleaning liquid flows in the stripping chamber providing the stripping liquid with the set temperature, then flows out of the stripping chamber, and enters the liquid jet head; the cleaning liquid output from the liquid jet head reaches the set temperature after heated by the stripping liquid in the stripping chamber, in this way, the stripping liquid and the photoresist remaining on the display substrate are better dissolved in the cleaning liquid with the set temperature, such that the stripping liquid and the photoresist remaining on the display substrate are effectively removed, the stripping liquid is prevented from being separated out on the display substrate, and is further prevented from being crystallized to block the output port of the liquid jet head; in addition, compared with the structure of separately heating the lower end of the liquid supplying pipeline of the liquid jet component, the stripping device effectively uses the thermal energy existing in the stripping chamber to save energy consumption.

Embodiment 3

The present embodiment provides a display substrate production line, comprising the stripping device in any one of embodiments 1-2.

By adopting the stripping device in any one of embodiments 1-2, not only the stripping effect of the photoresist on the display substrate is improved, but also the energy consumption of the display substrate production line is saved.

It can be understood that the above embodiments are merely exemplary embodiments intended to explain the principle of the present disclosure, but the present disclosure is not limited thereto. Those skilled in the art can make various modifications and improvements without departing from the spirit and essence of the present disclosure, and these modifications and improvements also fall into the protection scope of the present disclosure.

The invention claimed is:

1. A stripping device, comprising a stripping chamber and a cleaning chamber, wherein,
   a stripping liquid having a set temperature is provided within the stripping chamber,
   the stripping device further comprises a liquid jet component, the liquid jet component comprises a liquid supplying pipeline and a liquid jet head, the liquid supplying pipeline is configured to supply a cleaning liquid to the liquid jet head, the liquid jet head is configured to output the cleaning liquid, the liquid supplying pipeline is arranged in the stripping chamber, and the stripping liquid heats the cleaning liquid in the liquid supplying pipeline as the cleaning liquid flows through the liquid supplying pipeline arranged in the stripping chamber,
   the cleaning chamber is provided outside of, and communicated with, the stripping chamber, and
   in a direction from the stripping chamber to the cleaning chamber, the liquid supplying pipeline continuously extends from a first end of the stripping chamber to a second end, which is connected with the cleaning chamber and opposite to the first end, of the stripping chamber without disconnecting at a center portion of the stripping chamber.

2. The stripping device according to claim 1, wherein a sprayer is arranged in the stripping chamber and is configured to spray the stripping liquid having the set temperature.

3. The stripping device according to claim 1, wherein the stripping chamber includes a plurality of sub-stripping chambers, the plurality of sub-stripping chambers are mutually communicated to form the stripping chamber, and the liquid supplying pipeline is continuously arranged in the plurality of sub-stripping chambers.

4. The stripping device according to claim 1, wherein the liquid supplying pipeline includes two or more sub-pipelines, which are parallel with one another and are connected end to end in sequence.

5. The stripping device according to claim 1, wherein the liquid supplying pipeline is zigzagged in a continuous S-shaped curve.

6. The stripping device according to claim 1, wherein the liquid supplying pipeline is arranged in a spiral curve.

7. The stripping device according to claim 1, wherein the liquid supplying pipeline is paved at a bottom of the stripping chamber.

8. The stripping device according to claim 1, wherein the liquid supplying pipeline is suspended on a side wall of the stripping chamber.

9. The stripping device according to claim 1, wherein the liquid jet head is located outside the stripping chamber and the liquid jet head is connected to an end part of one end of the liquid supplying pipeline.

10. The stripping device according to claim 9, wherein the liquid jet component further includes a supplying source for supplying the cleaning liquid, and wherein an end part of the other end of the liquid supplying pipeline is connected to the supplying source.

11. The stripping device according to claim 10, wherein the supplying source includes a liquid supplying tank for containing the cleaning liquid and a pressure pump for inputting the cleaning liquid in the liquid supplying tank into the liquid supplying pipeline.

12. The stripping device according to claim 11, wherein a pressure output from the pressure pump is in direct proportion to a flow rate of the cleaning liquid in the liquid supplying pipeline, and wherein the pressure output from the pressure pump is adjustable.

13. The stripping device according to claim 1, wherein the liquid jet head is provided in the cleaning chamber.

14. The stripping device according to claim 13, wherein the cleaning chamber further includes a plurality of sprayers for spraying the cleaning liquid, and wherein the plurality of sprayers are different from the liquid jet head.

15. A display substrate production line, comprising the stripping device according to claim 1.

* * * * *